United States Patent [19]

Struthoff

[11] 4,381,499

[45] Apr. 26, 1983

[54] MONOLITHIC INTEGRABLE R-2R NETWORK

[75] Inventor: Holger Struthoff, Freiburg, Fed. Rep. of Germany

[73] Assignee: ITT Industries, Inc., New York, N.Y.

[21] Appl. No.: 318,887

[22] Filed: Nov. 6, 1981

[30] Foreign Application Priority Data

Nov. 27, 1980 [DE] Fed. Rep. of Germany ..... 80107406

[51] Int. Cl.³ .......................................... H03K 13/02
[52] U.S. Cl. ............................. 340/347 DA; 307/571
[58] Field of Search ............... 340/347 DA; 307/304, 307/221 C, 571

[56] References Cited

U.S. PATENT DOCUMENTS

| | | | |
|---|---|---|---|
| 3,755,807 | 8/1973 | Brown | 340/347 DA |
| 3,940,760 | 2/1976 | Brokaw | 340/347 DA |
| 4,267,550 | 5/1981 | Cecil | 340/347 DA |
| 4,308,467 | 12/1981 | Kolluri | 340/347 DA X |

*Primary Examiner*—C. D. Miller

*Attorney, Agent, or Firm*—John T. O'Halloran; Alfred C. Hill

[57] ABSTRACT

A monolithic integrable R-2R resistor network comprises a number of series resistors connected to a terminal resistor; and a plurality of 2R resistor units each capable of being switched by two electronic switches either to ground or to another reference point, a different plurality of 2R resistor units being coupled to the nodes between each of the series resistors, to the node between the terminal resistor and the last resistor of the series resistors and to the node ahead of the first resistor of the series resistors. To compensate for the effects of the variations of the switch resistances caused during manufacture by process parameter fluctuations upon the accuracy of a D/A converter, a switch structure is inserted at each of the nodes which, with respect to the two electronic switches, is of the same kind, and which is permanently in an electrically conducting state. Preferably, there are used insulated-gate field-effect transistors and insulated-gate field-effect transistor structures, the identical electrodes of which, for example, the source electrodes, are directly connected to each of the nodes.

9 Claims, 4 Drawing Figures

MONOLITHIC INTEGRABLE R-2R NETWORK

BACKGROUND OF THE INVENTION

The present invention relates to resistor networks and more particularly to R-2R resistor networks employed in particular with D/A (digital-to-analog) converters.

Prior art R-2R resistor networks are described in "Technische Informationen für die Industrie" No. 791221 "Digital/Analog-Wandler Grundlagen und Anwendungen" by Valvo (December 1979) and to the German technical journal "Elektronikpraxis" No. 8 (August 1979) pp. 3 to 16.

When such R-2R resistor networks are employed with D/A converters, there are used electronic switches with the aid of which each of the 2R resistors, in accordance with a digital word, can be applied either to ground or to another reference point. The reference point is determined by the type of the D/A converter with a distinction being made between current-controlled and voltage-controlled D/A converters.

When manufacturing the electronic switches, especially in the case of a monolithic integration thereof within a solid state circuit, the switch resistances thereof are subject to variations owing to process parameter fluctuations during production. In the case of the R-2R resistor networks, this has unpleasant effects upon the accuracy.

When considering, for example, the R-2R resistor network of an 8-bit D/A converter having an accuracy of ½LSB(least significant bit), high demands have to be placed on the series resistors R and the shunt 2R resistors, as well as on the accuracy of the switch resistors. In the case of an absolute switch resistance variation of ±20% and an ideal R-2R resistor network, the RS/2R ratio may in the utmost be 0.004. In the case of a 2R resistor of 8 kilohms there is obtained a switch resistance of 32 ohms. A switch having such a low resistance can only be realized with the aid of large-surface dimensioning. Owing to the high input capacitances, there are obtained disadvantageously long switching times.

SUMMARY OF THE INVENTION

It is, therefore, an object of the present invention to provide a monolithic integrable R-2R resistor network with which the effects of the variations of the switch resistances of the electronic switches upon the accuracy of a converter, which are due to process parameter fluctuations, are diminished. Another object of the present invention is to provide a monolithic integrable R-2R resistor network which compensates for the decrease in accuracy of a converter due to process parameter fluctuations.

A feature of the present invention is the provision of a monolithic integrated R-2R network comprising: a plurality of R resistors a last one of which is coupled to a terminal resistor; a plurality of switch structures, one of which is coupled in series with a first of the plurality of resistors, another one of which is coupled in series between the last one of the plurality of resistors and the terminal resistor and each of the remainder of the plurality of switch structures is coupled in series between different adjacent ones of the plurality of resistors; each of the plurality of switch structures being in a conducting state, and a plurality of 2R resistor units each having two electronic switches to connect the associated one of the plurality of units to a selected one of ground and another reference point, each of the two switches of each of the plurality of units having a common terminal connected to each other and one terminal of a different one of the plurality of switch structures.

The term "switch structures" means switches which are of the same type as the electronic switches with the parts thereof being manufactured together with those of the electronic switches. Thus, when using field-effect transistors for the electronic switches, the switch structures should be field-effect transistor structures whose zones and gate electrode including the gate oxide layer, manufactured simultaneously on or in a common semiconductor body. The same applies to bipolar transistors, especially to I²L transistors, the zones of which are diffused simultaneously into a semiconductor body together with the zones of an I²L switch structure built up in the same way, and diffused into the surface of a common semiconductor body.

Moreover, the accuracy of a converter in which there is used a R-2R resistor network according to the present invention, is further improved in that the resistance of the switch structures is chosen to be half as high as that of the turn-on resistance of the electronic switches. Because in this case, the variations of the switch resistances, relative to the series resistances of the switch structures, are included in the same resistance ratio as that of the resistors connected therewith.

A further substantial improvement to compensate for the disadvantageous effects of the process parameter fluctuations is achieved in that the one terminal of the two electronic switches is each time connected to the associated node, and that in series with each of the electronic switches there is arranged each time one 2R-resistor. In this case the terminals of the same kind, namely the source electrodes in the case of an employment of field-effect transistors and field-effect transistor structures, or else the emitter electrodes in the case of an employment of bipolar transistors and bipolar transistor structures, are at the same potential. In this way there will result the same compensation of the variation of the turn-on resistances with respect to the switch structures and the electronic switches, because these turn-on resistances are in a good approximation inversely proportional to the product from the B-value and the difference of the voltage between the nodes and the threshold voltage.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
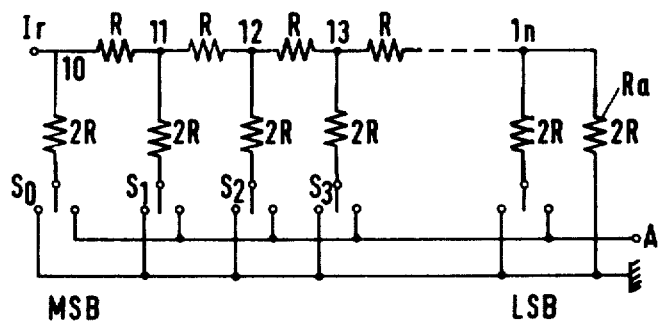
FIG. 1 is a schematic diagram of a known current-controlled R-2R network.
Figure 2:
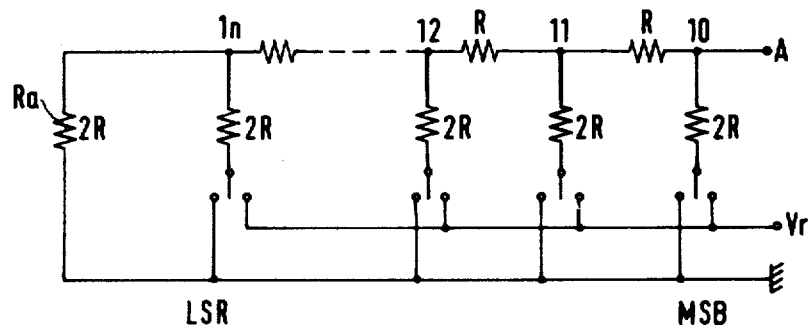
FIG. 2 is a schematic diagram of a known voltage-controlled R-2R network.

The present invention can be employed with the known current-controlled R-2R resistor network according to FIG. 1 as well as with the known voltage-controlled R-2R resistor network according to FIG. 2. While with the current-controlled R-2R resistor network the one terminal of the individual 2R resistors is capable of being connected between ground and the output A, this one terminal of the individual 2R resistors in the case of the voltage-controlled R-2R resistor network according to FIG. 2 is capable of being switched between ground and the reference voltage Vr. Both networks contain the terminal resistor Ra at the end of the series resistors connected to ground which, as a rule, has the same value as the 2R resistors. The current-controlled R-2R resistor network according to FIG. 1 receives its reference current Ir at the end of the series-connected series resistors R remote from the terminal resistor Ra. In distinction thereto, at this end of the series connection of the series resistors R remote from the terminal resistor Ra, in the case of the current-controlled R-2R resistor network as shown in FIG. 2, the output signal is taken off at the output A.

Figure 3:
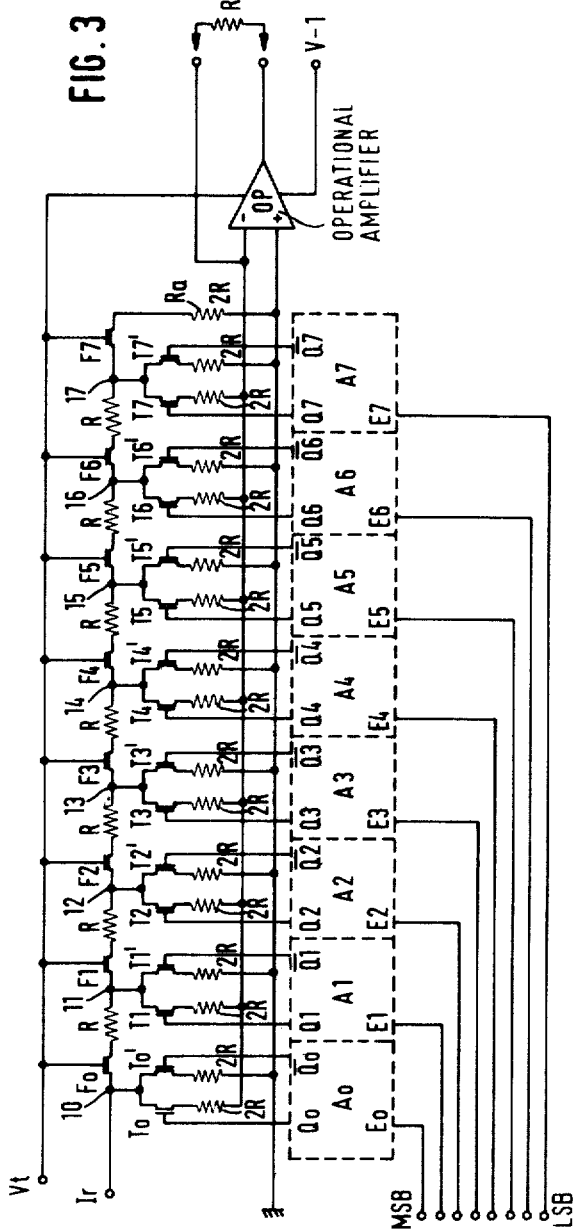
FIG. 3 is a schematic diagram of a D/A converter having a R-2R resistor network in accordance with the principles of the present invention employing field-effect transistors as the electronic switches and switch structures.

FIG. 3 is a schematic diagram of a D/A converter in which a R-2R resistor network according to the present invention is employed having insulated-gate field-effect transistors To, To' . . . T7, T7' as electronic switches. These transistors are manufactured together with the field-effect transistor switch structures Fo . . . F7 simultaneously in or on the surface side of a plate-shaped semiconductor substrate. This means that simultaneously the zones (source and drain zones) and, during the same processes, the gate electrodes including the gate-insulating layers are manufactured. In the course of further processes, the series resistors R and the 2R shunt resistors are manufactured preferably by way of ion implantation and a subsequent tempering, and the interconnections according to FIG. 3 are thereafter attached to the zones and the electrodes. In the course of this, the gate electrodes of the switch structures Fo . . . F7 are led to a common point of the circuit, so that they can be connected to a fixed potential, and so that the switch structures are continuously in the electrically conducting state.

When constructing the field-effect transistor electronic switches To . . . T7' and the field-effect transistor switch structures Fo . . . F7 there is chosen a ratio of the B-values (active power ratio) in such a way that the B-values of the field-effect transistors To to T7' are half as high as those of the field-effect transistor structures Fo to F7, so that accordingly, the resistance of each of the Fo to F7 structures amounts to one half of the turn-on resistance of the individual field-effect transistors To to T7'.

According to FIG. 3, the source electrodes of two field-effect transistors T and the source electrode of one field-effect transistor structure F intersect at a node connected to one terminal of each of the series connected resistors R or the reference input Ir. This means that the variations of the turn-on resistances of transistors T, when manufactured in a monolithic integrated form, are compensated optimally. One electrode of each transistor of each of the field-effect transistor pairs To, To'. . . T7 and T7' is connected to one terminal of a different one of two 2R resistors each of which has its other terminal connected to a different one of the two inputs of operational amplifier OP which may be omitted in the case of a converter having a current output. A calibrated resistor R1 is connected between the output of amplifier OP and the ungrounded input thereof.

The gate electrodes of each pair of field-effect transistors are applied bit wisely to the two outputs Qo, Qo'. . . Q7, Q7' of a different one of the input gates Ao . . . A7, with one bit of an 8-bit word being coupled to the inputs Eo . . . E7 thereof.

Figure 4:
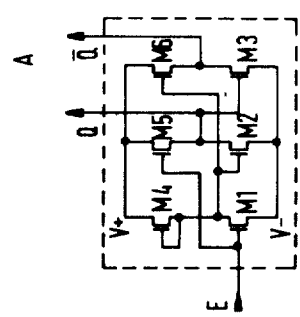
FIG. 4 is a schematic diagram of the input gate A of the D/A converter of FIG. 3.

FIG. 4 shows the circuit diagram of such an input gate which is constructed to have n-channel field-effect transistors and which, on its input side, contains the first inverter including the transistors M1 and M4. The output of the first inverter is connected, on one hand, to the gate electrode of transistor M2, arranged on the substrate side of a second inverter including the series arrangement of two field-effect transistors M2 and M5 and, on the other hand, to the gate electrode of transistor M6 of a third inverter having its drain electrode coupled to the supply voltage V+, the third inverter including the series arrangement of the two transistors M3 and M6. Moreover, the input E of the input gate A is coupled to the gate electrode of the insulated-gate field-effect transistor M5 having its drain electrode coupled to the supply voltage V+. The output signals Q and Q' of the input gate A, which are complementary in relation to one another, are each taken off a different one of the common connecting points of the two transistors M2, M5 of the second inverter and the two transistors M3, M6 of the third inverter.

The present invention offers the advantage of an extensive compensation of the effects of process parameter fluctuations upon the semiconductor wafers, which are simultaneously subjected to the necessary manufacturing processes, so that only substantially smaller variations enter into the result via the individual wafers. In addition thereto, the present invention also makes it possible to use electronic switches of smaller dimensions, because the relative variations of the R-2R network according to the present invention are significantly smaller than in the case of conventional types of R-2R networks. In this way it also becomes possible to realize D/A converters having shorter switching times.

While I have described above the principles of my invention in connection with specific apparatus it is to be clearly understood that this description is made only by way of example and not as a limitation to the scope of my invention as set forth in the objects thereof and in the accompanying claims.

I claim:

1. A monolithic integrated R-2R network comprising:
   a plurality of R resistors, a last one of which is coupled to a terminal resistor;
   a plurality of switch structures, one of which is coupled in series with a first of said plurality of resistors, another one of which is coupled in series between said last one of said plurality of resistors and said terminal resistor and each of the remainder of said plurality of switch structures is coupled in series between different adjacent ones of the remainder of said plurality of resistors, each of said plurality of switch structures being in a conducting state; and
   a plurality of 2R resistor units each having two electronic switches to connect the associated one of said plurality of units to a selected one of ground and another reference point, each of said two switches of each of said plurality of units having a common terminal directly connected to each other and one terminal of a different one of said plurality of switch structures.

2. A network according to claim 1 wherein:
each of said plurality of switch structures is a given type of transistor structure and each of said electronic switches is a transistor of said given type.

3. A network according to claim 2, wherein:
said transistor structure is an insulated-gate field-effect transistor structure and said transistor is an insulated-gate field-effect transistor.

4. A network according to claim 3 wherein:
said common terminals and said one terminal are source electrodes.

5. A network according to claim 2, wherein:
said common terminal and said one terminal are source electrodes.

6. A network according to claims 1, 2, 3, 4 or 5, wherein:
each of said plurality of switch structures has a resistance equal to one half of a turn-on resistance of each of said electronic switches.

7. A network according to claim 6, wherein:
each of said plurality of units further includes two 2R resistors each connected in series with a different one of said two electronic switches.

8. A network according to claims 1, 2, 3, 4 or 5 wherein:
each of said plurality of units further includes two 2R resistors each connected in series with a different one of said two electronic switches.

9. A network according to claim 8, further including an operational amplifier having a non-inverting input coupled to ground and one of said two 2R resistors and an inverting input coupled to the other of said two 2R resistors.

* * * * *